(12) United States Patent
Hayashi (10) Patent No.: US 8,877,005 B2
(45) Date of Patent: Nov. 4, 2014

(54) PLASMA PROCESSING APPARATUS AND ELECTRODE USED THEREIN

(75) Inventor: Daisuke Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 867 days.

(21) Appl. No.: 12/979,837

(22) Filed: Dec. 28, 2010

(65) Prior Publication Data

US 2011/0162799 A1 Jul. 7, 2011

Related U.S. Application Data

(60) Provisional application No. 61/307,601, filed on Feb. 24, 2010.

(30) Foreign Application Priority Data

Dec. 28, 2009 (JP) .................................. 2009-297688

(51) Int. Cl.
*C23F 1/00* (2006.01)
*H01L 21/306* (2006.01)
*C23C 16/00* (2006.01)
*H01J 37/32* (2006.01)
*H01L 21/67* (2006.01)

(52) U.S. Cl.
CPC ..... *H01L 21/67069* (2013.01); *H01J 37/32091* (2013.01); *H01J 37/3255* (2013.01)
USPC .................................. 156/345.43; 118/723 E (58) Field of Classification Search
USPC ....... 156/345.41, 345.43–345.47; 118/723 E, 118/723 MW
See application file for complete search history.

(56) References Cited

U.S. PATENT DOCUMENTS

| | | | |
|---|---|---|---|
| 2005/0211384 A1* | 9/2005 | Hayashi | 156/345.47 |
| 2005/0276928 A1 | 12/2005 | Okumura et al. | |
| 2008/0151467 A1* | 6/2008 | Simpson | 361/234 |
| 2010/0224323 A1 | 9/2010 | Himori | |
| 2010/0224325 A1 | 9/2010 | Himori et al. | |

* cited by examiner

*Primary Examiner* — Maureen Gramaglia
(74) *Attorney, Agent, or Firm* — Rothwell, Figg, Ernst & Manbeck, P.C.

(57) ABSTRACT

A plasma processing apparatus includes a depressurizable processing chamber; an electrode provided in the processing chamber; and a high frequency power supply for supplying a high frequency power into the processing chamber to thereby generating a plasma. Further, the electrode includes a base formed of a dielectric material; a dielectric body buried in the base and formed of the same dielectric material as the base; and a conductive adhesive layer provided in a bonding portion between the base and the dielectric body, the conductive adhesive layer bonding together and fixing the base and the dielectric body to each other.

20 Claims, 8 Drawing Sheets

PLASMA PROCESSING APPARATUS AND ELECTRODE USED THEREIN

CROSS-REFERENCE TO RELATED APPLICATION

This application claims the benefit of priority to Japanese Patent Application No. 2009-297688 filed on Dec. 28, 2009 and U.S. Provisional Application No. 61/307,601 filed on Feb. 24, 2010, the entire contents of which are incorporated herein by reference.

FIELD OF THE INVENTION

The present invention relates to a plasma processing apparatus for performing a desired processing on a target object by using a plasma; and, more particularly, to a structure of an electrode used in the plasma processing apparatus.

BACKGROUND OF THE INVENTION

A capacitively coupled (parallel plate) plasma processing apparatus, an inductively coupled plasma processing apparatus, a microwave plasma processing apparatus or the like has been put to practical use in an apparatus for performing a micro process such as an etching process or a film forming process on a target object to be processed by using a plasma. Especially, the parallel plate type plasma processing apparatus generates an electric field energy by applying a high frequency power to at least one of an upper electrode and a lower electrode facing each other. The generated electric field energy excites a gas to generate a plasma, thereby performing the micro process on the target object.

Along with recent demands for the device scaling-down, it becomes necessary to supply a relatively high frequency power of about 100 MHz to generate a high-density plasma. As the frequency of the supplied power becomes higher, a high frequency current flows from an end portion to a central portion on the plasma-side surface of the electrode due to the skin effect.

Figure 3A:
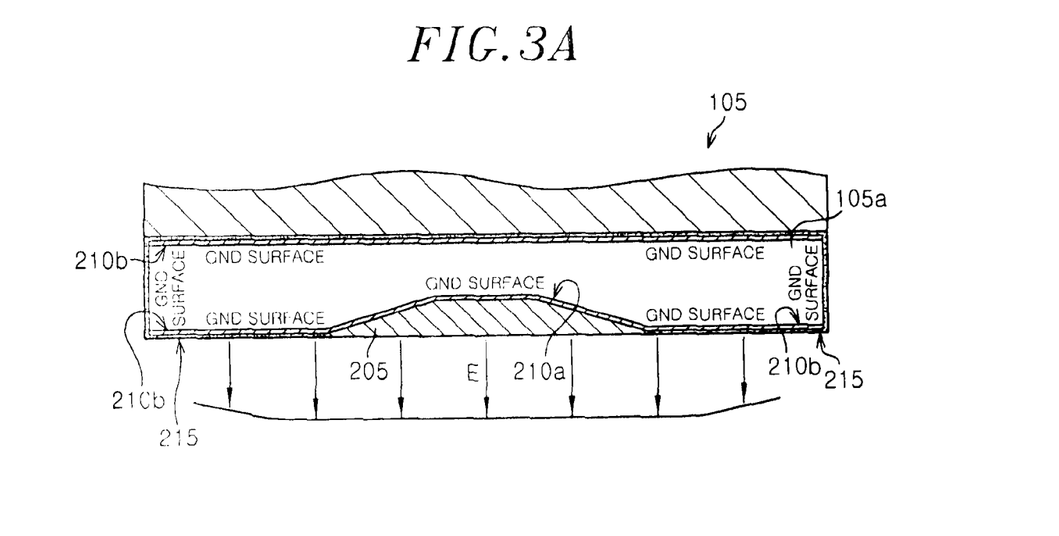
FIGS. 3A to 3C are views for explaining relationships between a structure of an upper electrode and an electric field strength.
Figure 3B:
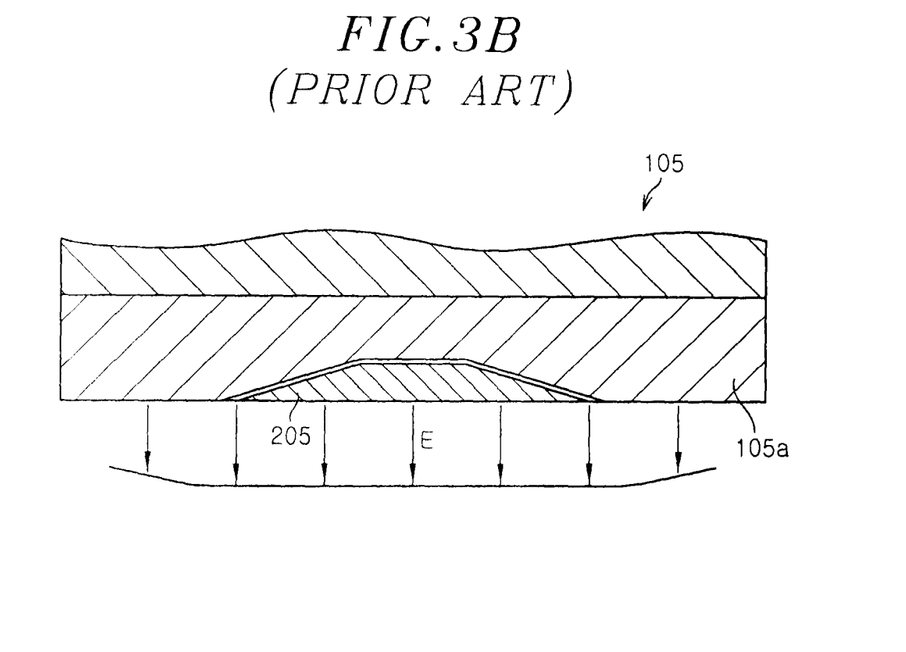
Figure 3C:
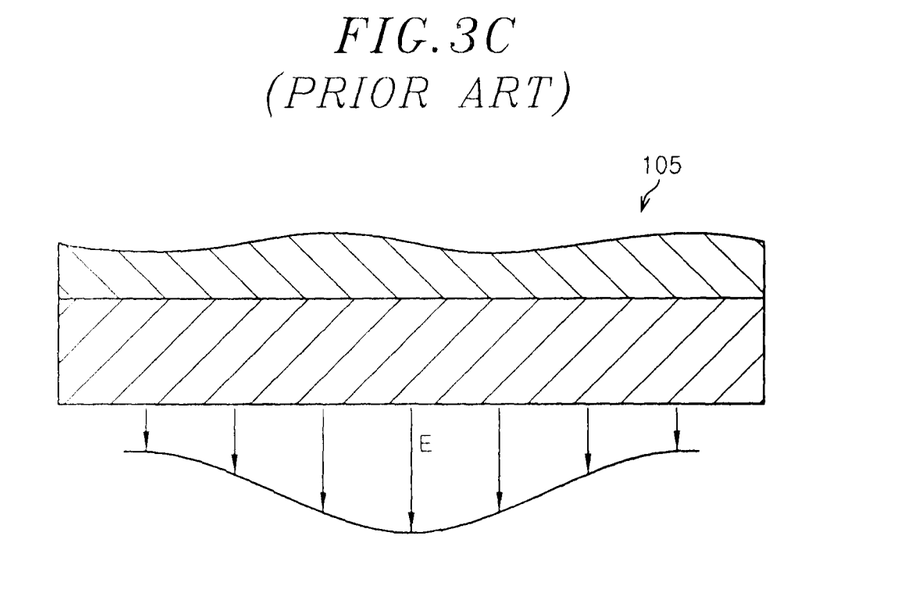

Thus, as shown in FIG. 3C, the electric field strength E becomes higher at the central portion of the electrode 105 than at the end portion of the electrode 105. Hence, the more electric field energy can be consumed for plasma generation at the central portion of the electrode than at the end portion of the electrode, which leads to more ionization or dissociation of a gas at the central portion of the electrode than at the end portion.

Accordingly, the plasma electron density Ne at the central portion of the electrode becomes higher than that at the end portion thereof. The resistivity of the plasma is decreased at the central portion of the electrode with the higher electron density Ne, so that a current with a high frequency (electromagnetic wave) is concentrated on a central portion of the facing electrode, which further results in non-uniformity of the plasma density.

In order to improve the uniformity in the plasma density, there is suggested a method of burying a dielectric material, e.g., ceramics, in the central portion of the plasma-side surface of the electrode (see, e.g., Japanese Patent Application Publication No. 2004-363522). With such method, further, the dielectric body 205 buried in the electrode 105 has a tapered portion with a gradually reduced thickness from its central portion toward its periphery, as can be seen from FIG. 3B.

In that case, a capacitance component becomes larger at an end portion of the dielectric body 205 than at the central portion thereof, so that the electric field strength E is not excessively lowered at the end portion of the dielectric body 205 as compared with a case where a flat dielectric body is buried. As a result, it is possible to improve the uniformity in the electric field strength distribution.

Meanwhile, in the electrode 105 shown in FIG. 3B, an upper base 105a is formed of a metal and the dielectric body 205 is formed of ceramics. Therefore, if heating and cooling during processing are repetitively performed in a state where the tapered dielectric body 205 is buried in the upper base 105a, a difference in thermal expansion of the upper base 105a and the dielectric body 205 causes stress concentration at a bonding portion therebetween. Accordingly, there occur problems such as development of cracks in the electrode 105 and contamination of the chamber.

In consideration of this, a proper gap may be provided between the dielectric body 205 and the upper base 105a. However, if the dielectric body 205 has a tapered shape, the dimensional accuracy is deteriorated at the tapered portion due to a lack of machining accuracy. This results in stress concentration at the tapered portion of the dielectric body 205 due to a difference in thermal expansion.

The stress concentration is also caused by a difference in thermal conductivity due to a tapering thickness of the dielectric body 205 or a discrepancy in dimensional tolerance of the gap. It may also cause cracks of the upper electrode 105 and contamination of the chamber.

SUMMARY OF THE INVENTION

In view of the above, the present invention provides a plasma processing apparatus capable of stably controlling a strength of high frequency electric field.

In accordance with a first aspect of the present invention, there is provided a plasma processing apparatus including: a depressurizable processing chamber; an electrode provided in the processing chamber; and a high frequency power supply for supplying a high frequency power into the processing chamber to thereby generating a plasma, wherein the electrode includes a base formed of a dielectric material; a dielectric body buried in the base and formed of the same dielectric material as the base; and a conductive adhesive layer provided in a bonding portion between the base and the dielectric body. The conductive adhesive layer bonds and fixes the base and the dielectric body together.

The base of the electrode which is conventionally formed of a metal and the dielectric body buried in the base are formed of a same material. Further, the base and the dielectric body are adhered and fixed to each other by the conductive adhesive layer. This makes it possible to obtain an electrode having a stable structure which does not develop a difference in thermal expansion. In other words, since the base and the dielectric body are formed of the same material, there develops no thermal expansion difference, and problems such as generation of cracks caused by stress and contamination of the chamber are avoided. Besides, since the base and the dielectric body formed of the same material are bonded, the adhesion can be easily performed and, also, an ideal adhesion method such as metallization or the like can be employed.

Further, when the high frequency current flows along the metal surface of the first electrode, the high frequency energy is distributed by the capacitance of the dielectric body buried into the base and, thus, the high frequency electric field strength can be decreased at the central portion of the dielectric body. As a result, it is possible to improve the uniformity in the high frequency electric field strength over the plasma-side surface of the first electrode.

In accordance with a second aspect of the present invention, there is provided an electrode used in a plasma processing apparatus for introducing a processing gas into a depressurizable processing chamber, generating a plasma by supplying a high frequency power to the processing chamber, and performing plasma processing on a target object, including: a base provided in the processing chamber and formed of a dielectric material; a dielectric body buried in the base and formed of the same material as the base; and a conductive adhesive layer provided between the base and the dielectric body to bond and fix therebetween.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Hereinafter, embodiments of the present invention will be described with reference to the accompanying drawings which form a part hereof. Throughout this specification and the drawings, like reference numerals designate like parts performing substantially identical functions, and redundant description thereof will be omitted.

<First Embodiment>

First, a plasma processing apparatus having an electrode structure in accordance with a first embodiment of the present invention will be described.

(Entire Configuration of Plasma Processing Apparatus)

Figure 1:
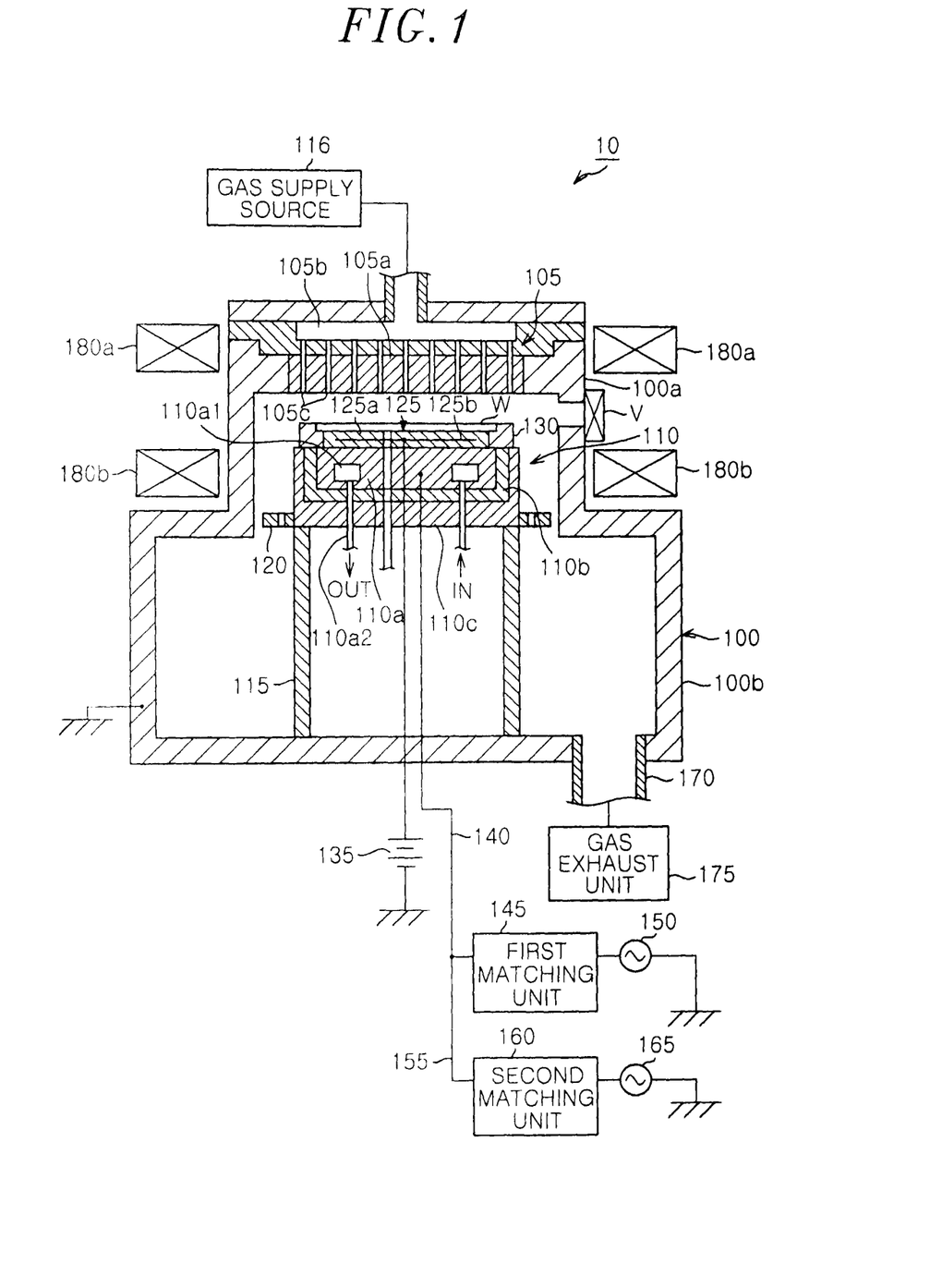
FIG. 1 is a vertical cross sectional view of a RIE plasma etching apparatus in accordance with an embodiment of the present invention.

FIG. 1 shows a reactive ion etching (RIE) plasma etching apparatus (parallel plate type plasma processing apparatus) having an electrode in accordance with the first embodiment of the present invention. The RIE plasma etching apparatus 10 is an example of a plasma processing apparatus for performing a desired plasma processing.

The RIE plasma etching apparatus 10 includes a depressurizable processing chamber 100. The processing chamber 100 has an upper chamber 100a and a lower chamber 100b having a larger diameter than that of the upper chamber 100a. The processing chamber 100 is formed of a metal, e.g., aluminum or the like, and is grounded.

In the processing chamber, the upper electrode 105 and the lower electrode 110 are disposed to face each other, thereby forming a pair of parallel plate electrodes. A wafer W is loaded into the processing chamber 100 via a gate valve V and mounted on the lower electrode 110. A processing gas is introduced into the processing chamber 100 and a high frequency power is supplied thereto, thereby generating a plasma. The wafer W mounted on the lower electrode 110 is etched by the plasma thus generated.

The upper electrode 105 has an upper base 105a and a gas diffusion portion (conductive base plate) 105b which form a showerhead, the gas diffusion portion 105b being disposed directly above the upper base 105a. A gas is supplied from a gas supply source 116 and diffused in the gas diffusion portion 105b. Then, the gas passes through gas channels provided at the gas diffusion portion 105b and is uniformly introduced from a plurality of gas holes 105c of the upper base into the processing chamber 100.

The lower electrode 110 has a lower base 110a formed of a metal such as aluminum or the like. The lower base 110a is supported by a support 110c via an insulation layer 110b and thus is electrically floated. A lower portion of the support 110c is covered by a cover 115. A baffle plate 120 is provided at the outer periphery of the lower portion of the support 110c to control a gas flow.

A coolant reservoir 110a1 is provided in the lower electrode 110. A coolant is introduced from an "IN" side of a coolant introduction line 110a2. The coolant is circulated in the coolant reservoir 110a1 and then discharged from an "OUT" side of the coolant introduction line 110a2. Accordingly, the lower electrode 110 is controlled to be maintained at a desired temperature.

An electrostatic chuck mechanism 125 provided directly above the lower electrode 110 includes an insulation member 125a and a metal sheet member 125b buried therein. A direct current (DC) power supply 135 is connected to the metal sheet member 125b. When a DC voltage outputted from the DC power supply 135 is applied to the metal sheet member 125b, the wafer W is electrostatically adsorbed to the lower electrode 110. A focus ring 130 formed of, e.g., silicon, is provided at the outer periphery of the electrostatic chuck mechanism 125 to maintain the uniformity of the plasma.

The lower electrode 110 is connected to a first matching unit 145 and a first high frequency power supply 150 via a first power feed rod 140. A gas in the processing chamber 100 is excited by the electric field energy of the high frequency power outputted from the first high frequency power supply 150. Accordingly, a plasma is generated by an electric discharge, and the wafer W is etched by the plasma thus generated.

The lower electrode 110 is further connected to a second matching unit 160 and a second high frequency power supply 165 via a second power feed rod 155 branched from the first power feed rod 140. A high frequency bias voltage having a frequency of, e.g., 3.2 MHz, outputted from the second high frequency power supply 165 is used for attracting ions into the lower electrode 110.

A gas exhaust port 170 is provided at a bottom surface of the processing chamber 100. By driving a gas exhaust unit 175 connected to the gas exhaust port 170, the interior of the processing chamber 100 is maintained at a desired vacuum state.

Multi-pole ring magnets 180a and 180b are arranged around the upper chamber 100a. In the multi-pole ring magnets 180a and 180b, a plurality of columnar anisotropic segment magnets is attached to a ring-shaped magnetic material casing, wherein the magnetic poles of the adjacent columnar anisotropic segment magnets are arranged to have opposite directions to each other. Hence, magnetic force lines are formed between the adjacent segment magnets and a magnetic field is only formed along peripheral area around the processing space between the upper electrode 105 and the lower electrode 110, thereby confining the plasma within the processing space.

Figure 2:
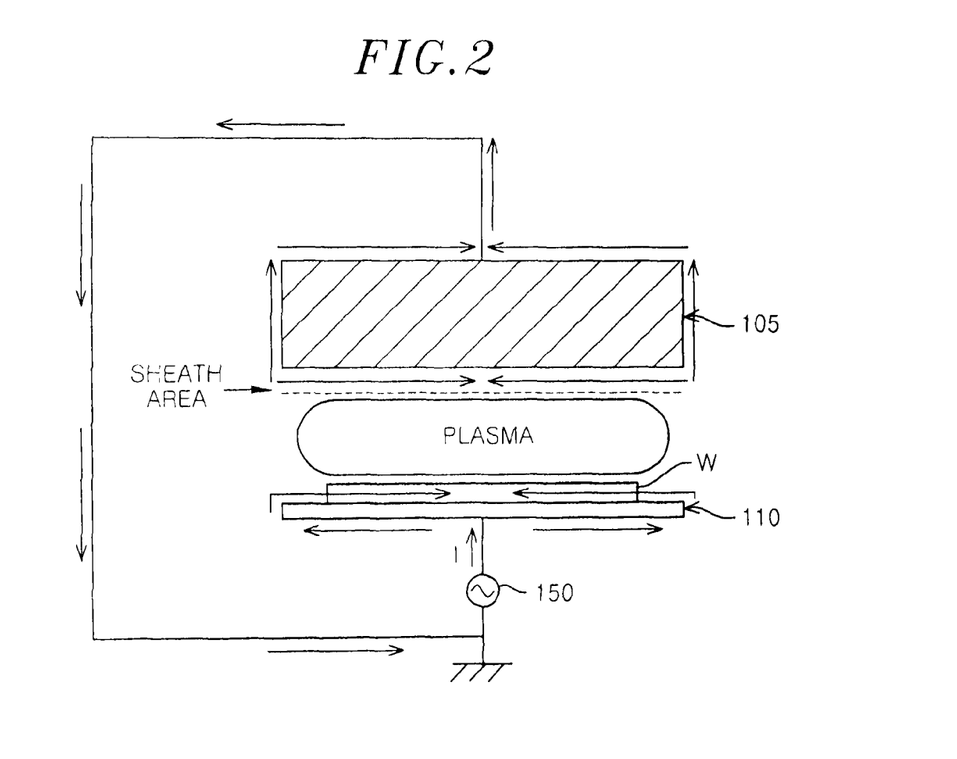
FIG. 2 shows flows of high frequency in the RIE plasma etching apparatus.

As shown in FIG. 2, when the high frequency power of, e.g., 100 MHz, is applied from the first high frequency power supply 150 to the lower electrode 110, a high frequency current propagates along the surface of the lower electrode 110 from the end portion of the top surface of the lower electrode 110 to the central portion thereof due to the skin effect. Therefore, the electric field strength at the central portion of the lower electrode 110 becomes higher than that at the end portion thereof. This makes it easier for a gas to ionize or dissociate at the central portion of the lower electrode 110 than at the end portion of the lower electrode 110.

Accordingly, an electron density Ne of the plasma becomes higher at the central portion of the lower electrode 110 than at the end portion thereof. A resistivity of the plasma is decreased at the central portion of the lower electrode 110 with a higher plasma electron density Ne and, due to the high frequency, the current focuses on the central portion of the upper electrode 105 facing the lower electrode 110. This causes further non-uniformity of the plasma density. As a result, as shown in FIG. 3C, the electric field strength E becomes higher at the central portion than at the peripheral portion of the plasma-side surface of the upper electrode.

In order to improve the uniformity in the plasma density, a tapered dielectric body 205 formed of, e.g., ceramics, is buried in the central portion of the plasma-side surface of the upper electrode 105 in the conventional example shown in FIG. 3B. The dielectric body 205 is formed in a tapered shape having a thickness that is gradually decreased from its central portion toward its peripheral portion.

Thus, the capacitance component becomes higher at the end portion of the dielectric body 205 than at the central portion of the dielectric body 205. Accordingly, the high frequency power is distributed from the central portion to the end portion of the dielectric body 205 and, hence, the high frequency electric field strength can be decreased at the central portion of the dielectric body 205. As a result, the electric field strength E becomes more uniform.

However, in the structure where the tapered dielectric body 205 is buried in the upper base 105*a* formed of a metal, repetitive heating and cooling of the upper electrode 105 causes a difference in thermal expansion and stress concentration at the bonding portion. Thus, cracks are developed and the chamber is contaminated. To that end, conventionally, it is considered to provide an appropriate gap between the dielectric body 205 and the upper base 105*a*. However, since the dielectric body 205 has a tapered shape, it is difficult to provide and maintain a desired size of the gap due to the difference in thermal expansion.

In accordance with the present embodiment, the upper base 105*a* and the dielectric body 205 buried therein are formed of the same material and are bonded and fixed together by a conductive adhesive layer 210*a* without a gap between the upper base 105*a* and the dielectric body 205.

Since the upper base 105*a* and the dielectric body 205 are formed of the same material, there is no difference in the thermal expansion therebetween so that breakage caused by a stress concentration can be avoided. Besides, since the base and the dielectric body formed of the same material are bonded together, the bonding can be easily performed and, also, an ideal adhesion method such as metallization or the like can be employed.

(Electrode Structure)

Hereinafter, a structure of an electrode in accordance with the present embodiment will be described in detail with reference to FIG. 3A. As described above, the upper electrode 105 includes the upper base 105*a*, the dielectric body 205, and the conductive adhesive layer 210*a*. The upper base 105*a* is formed of alumina ($Al_2O_3$). However, the upper base 105*a* is not limited thereto and may be formed of a dielectric material such as silicon nitride ($Si_3N_4$) or aluminum nitride (AlN). When the upper base 105*a* is formed of alumina ($Al_2O_3$), its thermal conductivity is higher than or equal to about 30 W/m·K. When the upper base 105*a* is formed of silicon nitride ($Si_3N_4$), its thermal conductivity is about 30 to 70 W/m·K. When the upper base 105*a* is formed of aluminum nitride (AlN), its thermal conductivity is higher than or equal to about 150 W/m·K.

A tapered recess is formed at the center of the upper base 105*a*. The dielectric body 205 is formed to have a smaller size than or equal to that of the tapered recess such that the dielectric body 205 can be buried in the tapered recess of the upper base 105*a*. The dielectric body 205 is formed of the same material as the upper base 105*a*. Similarly, when the dielectric body 205 is formed of alumina ($Al_2O_3$), its thermal conductivity is higher than or equal to about 30 W/m·K. When the dielectric body 205 is formed of silicon nitride ($Si_3N_4$), its thermal conductivity is about 30 to 70 W/m·K. When the dielectric body 205 is formed of aluminum nitride (AlN), its thermal conductivity is higher than or equal to about 150 W/m·K.

The upper base 105*a* and the dielectric body 205 are adhered to each other by the conductive adhesive layer 210*a*. Specifically, the conductive adhesive layer 210*a* is applied on the bonding portions of the upper base 105*a* and the dielectric body 205, and then the upper base 105*a* and the dielectric body 205 are bonded to each other.

More specifically, the conductive adhesive layer 210*a* is melted under conditions of a high temperature and a high pressure and applied on the bonding portions of the upper base 105*a* and the dielectric body 205, and then the upper base 105*a* and the dielectric body 205 are bonded together (metallization). When the conductive adhesive layer 210*a* is hardened, it serves as a metal layer between the upper base 105*a* and the dielectric body 205 and bonds the upper base 105*a* and the dielectric body 205 as one unit.

On the top and the bottom surface other than the bonding portions of the upper base 105*a*, conductive adhesive layers 210*b* are provided. A metal layer 215 is coated on top surfaces of the conductive adhesive layers 210*b* and the side surface of the upper base 105*a*. The conductive adhesive layer 210*b* provided on the bottom surface of the upper base 105*a* is connected to the conductive adhesive layer 210*a*.

The conductive adhesive layers 210*b* may be omitted as long as the metal layer 215 is definitely connected to the conductive adhesive layers 210*a*. In case where the conductive adhesive layers 210*b* are omitted, the metal layer 215 may be formed by thermally spraying a metal such as aluminum.

The thickness of the metal layer 215 is preferably equal to and more preferably greater than that of the conductive adhesive layer 210*a* formed at the contact portion. The resistivity of the conductive adhesive layers 210*a* and 210*b* is preferably about $10^{-6}$ to $10^{-2}$ Ω·cm, and more preferably about $10^{-5}$ Ω·cm. Moreover, the resistivity of the metal layer 215 is preferably about $5 \times 10^{-5}$ Ω·cm. The metal layer 215 is reliably electrically connected to the conductive adhesive layers 210*b* which is connected to the conductive adhesive layer 210a formed at the bonding portion, so that the conductive adhesive layers 210a and 210b and the metal layer 215 can have the same potential.

In the present embodiment, the conductive adhesive layers 210a and 210b and the metal layer 215 are connected to the processing chamber 100, and the surfaces thereof become ground surfaces. With such configuration, the entire surface of the upper base 105a formed of a dielectric material is covered by the conductive adhesive layers 210a and 210b and the metal layer 215 serving as ground surfaces. Hence, a dielectric portion of the upper base 105a is not exposed to the surface, and the upper base 105a does not serve as the dielectric material base but does as a metal plate. As a result, only the dielectric body 205 buried in the upper electrode 105 contributes to the distribution of the high frequency power.

In other words, when the high frequency current flows on surfaces of the conductive adhesive layers 210a and 210b and the metal layer 215, the high frequency power is distributed by the capacitance of the dielectric body 205 and, thus, the high frequency electric field strength can be decreased at the central portion of the dielectric body 205. As a consequence, the high frequency electric field strength outputted from the plasma-side surface of the upper electrode 105 can be made uniform.

(Gas Channel)

Figure 4:
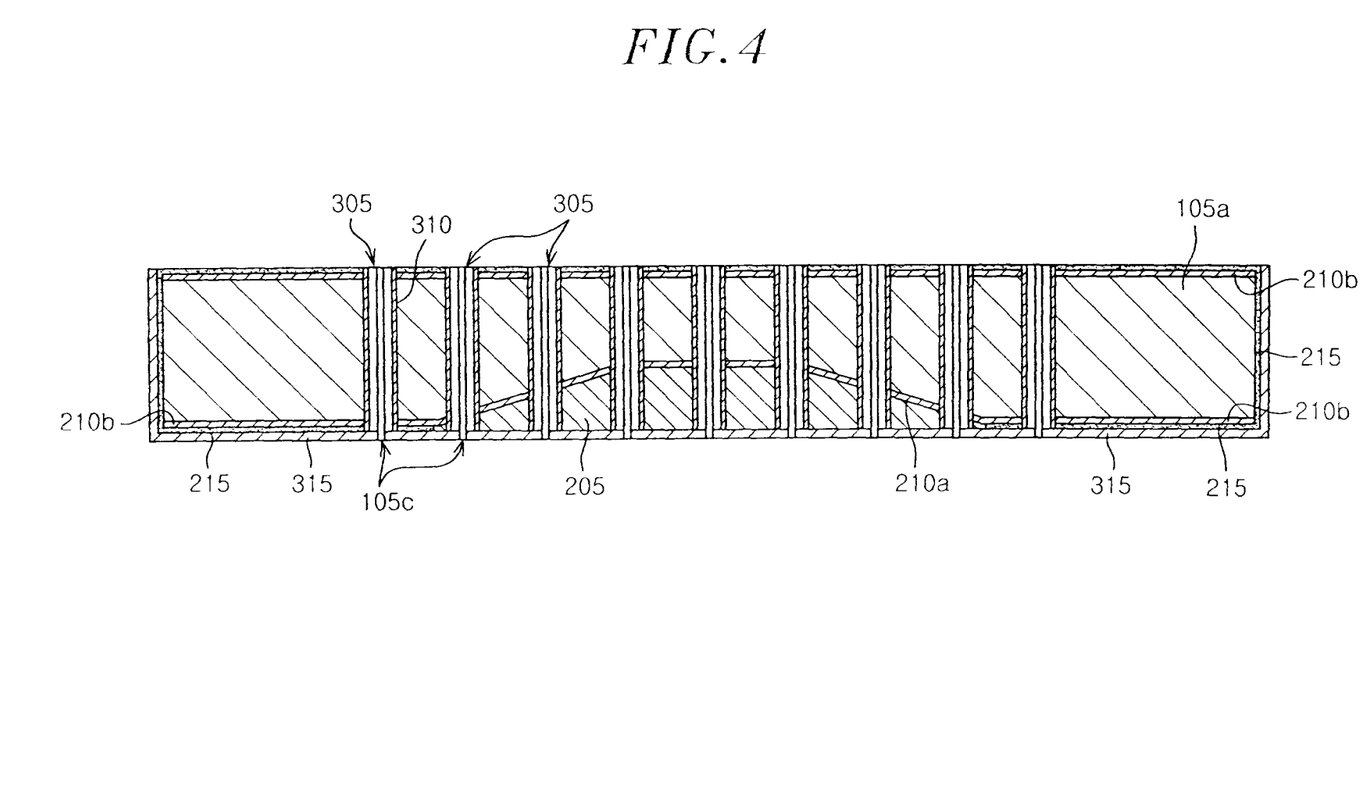
FIG. 4 is a cross sectional view of an upper electrode in accordance with a first embodiment of the present invention.

Hereinafter, gas channels formed at the upper electrode main body (the upper base 105a and the dielectric body 205) will be described with reference to FIG. 4. The gas channels are formed after the upper base 105a and the dielectric body 205 are bonded together to form a unit.

Specifically, after the upper base 105a and the dielectric body 205 are bonded together, through channels are formed by boring a hole through the integrated upper base 105a and the dielectric body 205. Then, a plurality of gas channel forming ceramic tubes 305 are inserted into the through channels serving as gas inlet lines. The gas channel forming ceramic tubes 305 are uniformly disposed at the upper base 105a and the dielectric body 205. Accordingly, the gas inlet lines are formed at the upper electrode 105.

The gas inlet lines communicate with the gas diffusion portion 105b. The gas diffused in the gas diffusion portion 105b passes through the gas inlet lines and is uniformly introduced from a plurality of gas holes 105c toward the plasma. The gas channels may be formed before the upper base 105a and the dielectric body 205 are bonded together.

The gas channel forming ceramic tubes 305 may be formed of one of quartz ($SiO_2$), silicon nitride ($Si_3N_4$), silicon carbide (SiC), alumina ($Al_2O_3$), aluminum nitride (AlN), and yttrium oxide ($Y_2O_3$). The gas channel forming ceramic tubes 305 are preferably formed of a same material as the upper base 105a and the dielectric body 205, or may be formed of a material different from those of the upper base 105a and the dielectric body 205.

The gas channel forming ceramic tubes 305 are adhered to the upper base 105a and the dielectric body 205 via ceramic tube adhesive layers 310. The gas channel forming ceramic tubes 305 may be formed by metallization. The radical resistance of the ceramic tube adhesive layers 310 is not considered to be important, but the ceramic tube adhesive layers 310 is requested to have generally up to about 220° C. and instantly up to about 250° C. of heat resistance.

The plasma-side surfaces of the dielectric body 205 and the upper base 105a bonded together, and the side surface of the upper base 105a are coated by a thermally sprayed layer 315. The thermally sprayed layer 315 is formed by thermally spraying an yttrium oxide film ($Y_2O_3$ film) having a high plasma resistance on the plasma side surface of the upper base 105a and the dielectric body 205 bonded, and the side surface of the upper base 105a. The thermally sprayed layer 215 is preferably formed after formation of the ceramic tubes 305.

As described above, in accordance with the present embodiment, the conductive adhesive layers 210a and 210b and the metal layer 215 are made to have the ground potential such that the upper base 105a can serve as a metal plate. Accordingly, the high frequency power can be changed based on the dielectric body 205. As a result, the high frequency electric field strength over the bottom surface (plasma-side surface) of the upper electrode 105 can be made uniform. A plurality of gas holes 105c uniformly opens at the upper electrode 105 toward the interior of the processing chamber. Accordingly, the gas introduced through the gas holes 105c is uniformly ionized and dissociated by a uniform high frequency electric field generated below the upper electrode 105, thereby generating an uniform plasma.

Besides, in accordance with the present embodiment, since the upper base 105a and the dielectric body 205 are formed of the same material, there is no thermal expansion difference developed therebetween. This makes it possible to avoid problems such as occurrence of cracks and contamination of the chamber. Further, since the upper base 105a and the dielectric body 205 are formed of the same material, an ideal bonding method can be used to easily bond the upper base 105a and the dielectric body 205.

<Second Embodiment>

Hereinafter, a structure of an electrode in accordance with a second embodiment of the preset invention will be described with reference to FIG. 5. The electrode of the present embodiment is different from that of the first embodiment in that there is no thermally sprayed layer 315, and a consumable top plate 405 is provided on the plasma side surface of the upper electrode 105 by interposing a top plate adhesive layer 400. The electrode of the second embodiment can be also applied to the upper electrode 105 of the RIE plasma etching apparatus 10 described in the first embodiment.

(Gas Channel)

Like the first embodiment, the upper base 105a and the dielectric body 205 are formed of a same material. Therefore, there is no thermal expansion difference between the upper base 105a and the dielectric body 205 so that problems such as occurrence of cracks and contamination of the chamber due to stress can be avoided.

In addition, the conductive adhesive layers 210a and 210b are connected to the metal layer 215 serving as a ground layer and thus have a ground potential as well. With such configuration, the upper base 105a can serve as a metal plate and, hence, the high frequency power can be changed based on the dielectric body 205. Accordingly, the high frequency electric field generated above the plasma-side surface of the upper electrode 105 can be made uniform, thereby generating an uniform plasma in the processing space.

Same as the first embodiment, the conductive adhesive layers 210a and 210b serve as high electric transport layers having resistivity of about $10^{-6}$ to $10^{-2}$ Ω·cm. Further, the metal layer 215 provided at portions other than the bonding portion between the upper base 105a and the dielectric body 205 reliably electrically connects between the conductive adhesive layers 210a and 210b.

Moreover, same as the first embodiment, the through channels are formed at the upper base 105a and the dielectric body 205 by inserting the gas channel forming ceramic tubes 305 and adhering the gas channel forming ceramic tubes 305 to the upper base 105a and the dielectric body 205 by the ceramic tube adhesive layers 310. The gas channel forming ceramic tubes 305 may be formed by metallization; and the ceramic tube adhesive layers 310 is requested to have a heat resistance generally up to about 220° C. and instantly up to about 250° C.

In accordance with the second embodiment, the bottom surfaces of the upper base 105a and the dielectric body 205 bonded are covered by a consumable top plate 405 by interposing a top plate adhesive layer 400. The top plate adhesive layer 400 is a detachable adhesive, so that the consumable top plate 405 can be exchanged.

Figure 5:
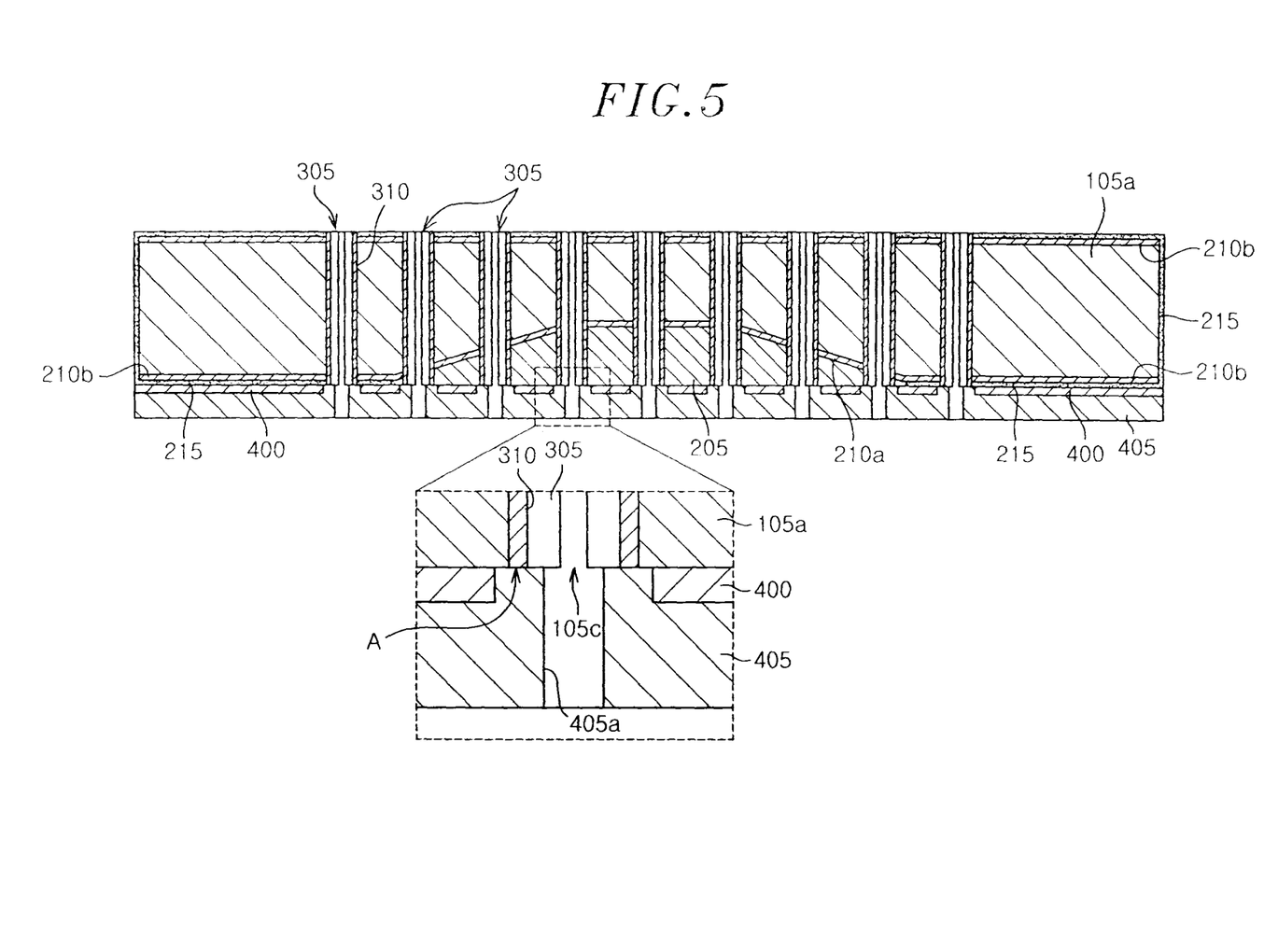
FIG. 5 is a cross sectional view of an upper electrode in accordance with a second embodiment of the present invention.

As can be seen from the enlarged view of the vicinity of the gas hole 105c illustrated in the lower part of FIG. 5, the top plate adhesive layer 400 is not exposed to the gas hole 105c. The consumable top plate 405 has preferably plasma resistance to protect the interior of the processing chamber from metal contamination. The consumable top plate 405 may be formed of, e.g., quartz ($SiO_2$), sapphire, silicon nitride ($Si_3N_4$), silicon carbide (SiC), alumina ($Al_2O_3$), aluminum nitride (AlN), yttrium oxide ($Y_2O_3$) or the like. When the consumable top plate 405 is formed of quartz or the like, thermal conductivity thereof is poor. Thus, the consumable top plate 405 is bonded and fixed to the electrode by the top plate adhesive layer 400. In this way, it is possible to improve adhesion and thermal conductivity of the consumable top plate 405 compared to the case where it is fixed only by a screw.

Openings 405a communicating with the gas holes 105c are formed at the consumable top plate 405. The diameter of the openings 405a is slightly greater than that of the gas holes 105c in consideration of the maintenance for exchanging the consumable top plate 405. In other words, because the openings 405a of the consumable top plate 405 are slightly larger than those of the gas holes 105c, the alignment of the consumable top plate 405 to the gas channels can be easily executed when the consumable top plate 405 is exchanged for repair.

In accordance with the present embodiment, it is possible to obtain the following effects in addition to the effects of the first embodiment. Specifically, when the consumable top plate 405 is damaged by the plasma and worn out, it is possible to detach the consumable top plate 405 by detaching the top plate adhesive layer 400 and then bond a new consumable top plate 405 by interposing the top plate adhesive layer 400. Hence, the upper electrode main body (the upper base 105a and the dielectric body 205) that is not easily exchanged can be effectively protected from damages caused by the plasma. As a result, a lifetime of the electrode can be increased, and process stabilization and cost reduction can be achieved.

In the present embodiment, further, the lower end portions A of the ceramic tube adhesive layers 310 are covered by the exchangeable consumable top plate 405 having plasma resistance without being exposed to the plasma. With this configuration, it is possible to prevent the thickness of the ceramic tube adhesive layer 310 from being reduced due to reaction of the ceramic tube adhesive layer 310 with oxygen radical in the plasma, for example.

<Modified Example of Second Embodiment>

Hereinafter, a structure of an electrode in accordance with a modified example of the second embodiment of the present invention will be described with reference to FIG. 6. The electrode in accordance with the modified example is different from that of the second embodiment in that there is no metal layer on the side surface of the upper base 105a and a peripheral portion of the plasma side surface of the upper base 105a. Specifically, a metal layer 215a is provided on a portion other than the peripheral portion of the plasma side surface of the upper base 105a and a metal layer 215b is provided on a surface opposite to the plasma side surface of the upper base 105a.

Further, a thermally sprayed surface layer 470 is provided to cover the top surface of the metal layer 215b, the side surface and the peripheral portion of the plasma side surface of the upper base 105a, and an outer side surface of the metal layer 215a. In addition, the upper base 105a is provided with columnar conductive bodies 460.

In accordance with the modified example, the conductive adhesive layers 210a and 210b are formed in the upper electrode 105 by metallization. Specifically, the metallization is performed by applying a soldering material on the surface of the upper base 105a, putting the upper base 105a into a furnace, and then making the solder melted therein by a high temperature. Herein, the soldering material needs to be put in between members.

In the example, the upper electrode 105 is manufactured by a manufacturing method including following steps (1) to (6).

(1) The consumable top plate 405 is detachably bonded to a surface of the metal layer 215a by the top plate adhesive layer 400.

(2) A soldering material is coated on the other surface of the metal layer 215a and the side surface thereof facing the dielectric body 205, and surfaces of the tapered and the central portions of the dielectric body 205.

(3) The applied soldering material is covered by the upper base 105a. The upper base 105a has through holes regularly spaced apart from each other in a circumferential direction at the peripheral portion thereof.

(4) Columnar conductive bodies 460 having the same shape as the through holes formed at the upper base 105a are inserted into the through holes.

(5) A soldering material is applied on the top surfaces of the upper base 105a and the columnar conductive bodies 460.

(6) The applied soldering material is covered by the metal layer 215b.

(7) The structure thus obtained is loaded into the furnace.

Accordingly, the metallized soldering materials on the top and the bottom surface of the upper base 105a serve as the conductive adhesive layers 210a and 210b, respectively. The metal layers 215a and 215b are connected to each other by the columnar conductive bodies 460. Hence, the metal layers 215a and 215b are electrically connected to each other, thereby making it possible to obtain the same effects as the second embodiment. The conductive adhesive layers 210a and 210b may be formed of the same metal or different metals.

The through holes formed at the upper base 105a are preferably provided at the outer periphery thereof. Moreover, the columnar conductive bodies 460 may be formed of a material having a linear expansion coefficient close to that of the soldering material, and may be formed of a material different from that of the soldering material. Further, the columnar conductive bodies 460, the metal layers 215a and 215b, and the solder material (conductive adhesive layers 210a and 210b) may be formed of, e.g., Kovar (registered trademark).

As the columnar conductive bodies 460, sixteen rod-shaped members having a diameter of about 3 mm may be spaced regularly. The thickness of each of the metal layers 215a and 215b is preferably, e.g., about 0.5 mm, or may be changed. The thickness of the top plate adhesive layer 400 is preferably, e.g., about 0.1 to 0.2 mm, or may be changed. The thickness of each of the conductive adhesive layers 210a and 210b and the metal layers 215a and 215b is preferably, e.g., about 0.01 mm, or may be changed.

In accordance with the modified example, the electrode can be manufactured simply by the steps (1) to (7), so that the manufacturing cost can be reduced considerably.

Figure 6:
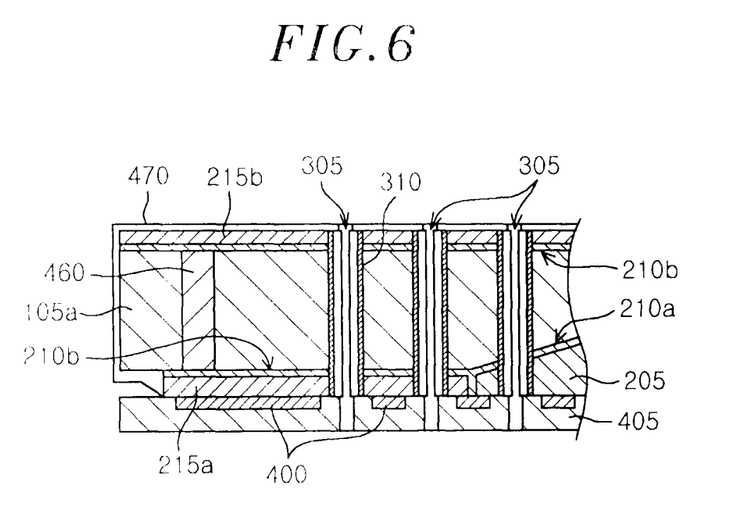
FIG. 6 is a fragmentary cross sectional view of an upper electrode in accordance with a modification of the second embodiment of the present invention.

After manufacturing processes of steps (1) to (7), a thermally sprayed surface layer 470 may be formed by thermally spraying yttrium oxide or the like on the top surface, the side surface and the peripheral portion of the upper base 105a, as shown in FIG. 6, to thereby increase plasma resistance. The thickness of the thermally sprayed surface layer 470 is preferably, e.g., about 0.01 mm. However, it is not limited thereto and may be changed.

Figure 7:
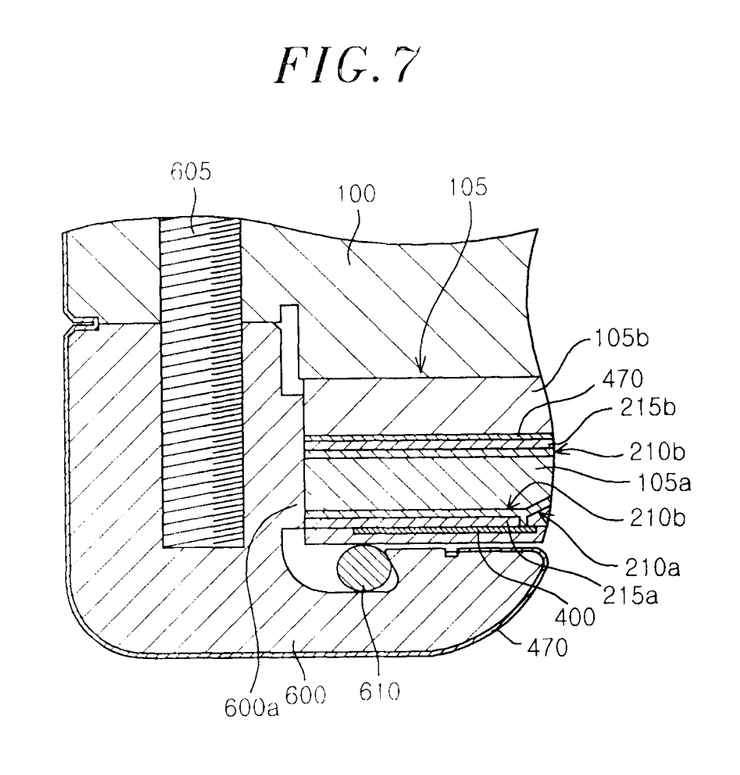
FIG. 7 is a partial cross sectional view of an upper electrode in accordance with another modification of the second embodiment of the present invention.

In another modified example, instead of connecting the metal layers 215a and 215b formed at the top and the bottom surface of the upper base 105a by the columnar conductive bodies 460, it is possible to provide at least one L-shaped conductive clamp 600 at an outer peripheral portion of the upper base 105a. The clamp 600 has a protrusion 600a whose end portion contacts with a side surface of the upper base 105a, the conductive adhesive layers 210b and the metal layers 215a and 215b, as shown in FIG. 7. Accordingly, the upper and the lower metal layers 215a and 215b are electrically connected to each other by the conductive clamp 600. This makes it possible for the metal layers 215a and 215b and the conductive adhesive layers 210a and 210b to have the ground potential.

The clamp 600 is tightly fixed the upper electrode 105 to the top plate of the processing chamber 100 by a screw 605 and a spring ring 610. Accordingly, the upper electrode 105 can be fixed to a ceiling surface of the processing chamber 100 by an elastic force of the spring ring 610 even though the clamp 600 is not screwed directly to the top plate. Further, the thermally sprayed surface layer 470 may be formed on the surface of the clamp 600 by thermally spraying yttrium oxide or the like.

<Third Embodiment>

Figure 8:
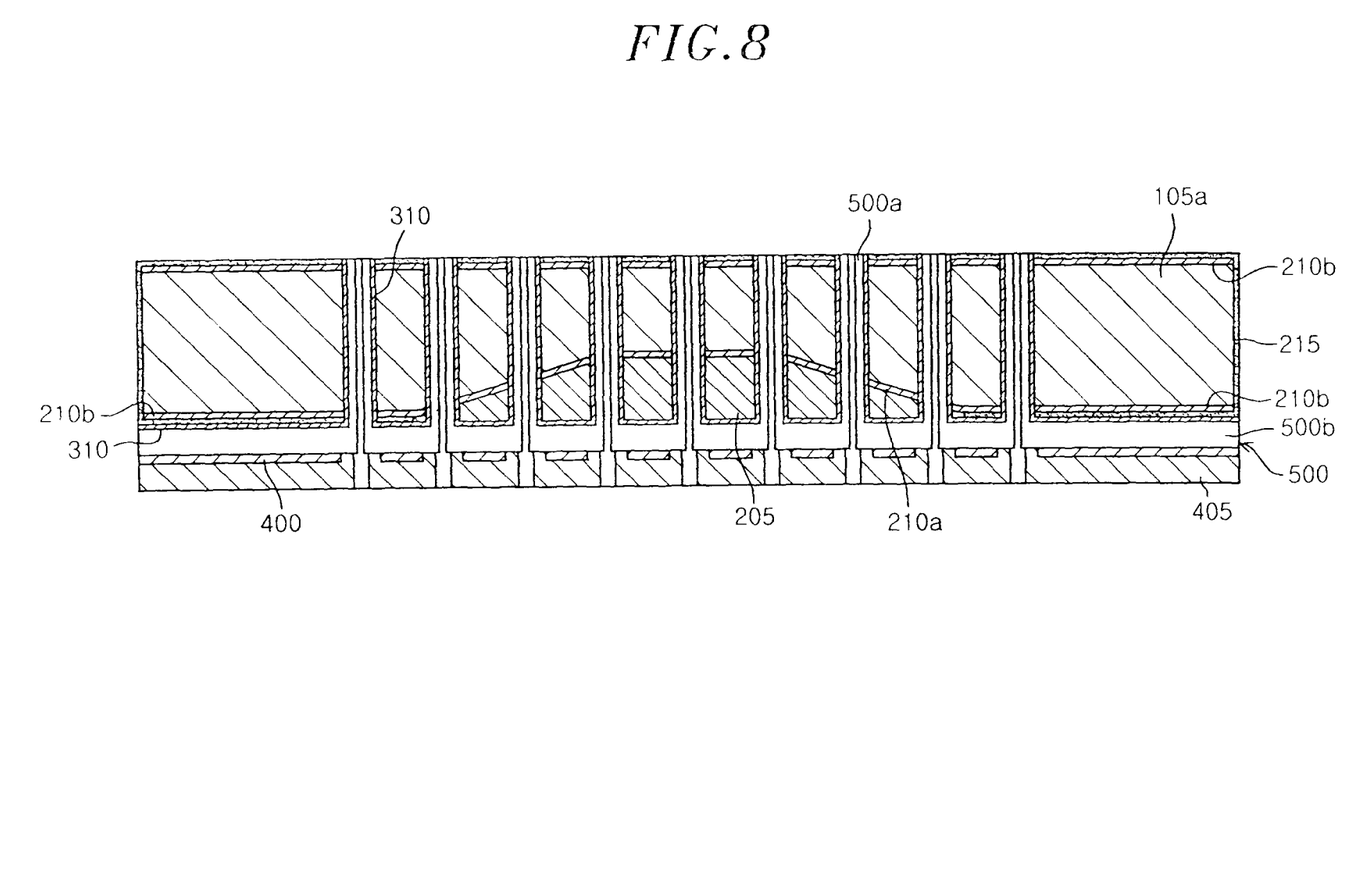
FIG. 8 is a cross sectional view of an upper electrode in accordance with a third embodiment of the present invention.

Hereinafter, a structure of an electrode in accordance with a third embodiment of the present invention will be described with reference to FIG. 8. The electrode of the third embodiment differs from that of the second embodiment in that the metal layer 215 is formed same as in the first embodiment and there are further provided the ceramic tube adhesive layer 310 and a plate 500 between the metal layer 215 and the top plate adhesive layer 400 and the consumable top plate 405, the plate 500 being integrated with ceramic tubes. The electrode of the third embodiment can be also applied to the upper electrode 105 of the RIE plasma etching apparatus 10 described in the first embodiment.

(Gas Channel)

In the present embodiment as well, the upper base 105a and the dielectric body 205 are formed of the same material. Thus, the thermal expansion difference is not developed, and problems such as occurrence of cracks and contamination of the chamber due to stress can be avoided. Further, the conductive adhesive layers 210a and 210b and the metal layers 215 have the ground potential. Hence, the high frequency power can be changed based on a position of the dielectric body 205. This makes it possible to improve the uniformity of the high frequency electric field generated below the upper electrode 105.

Like the first and the second embodiment, the conductive adhesive layers 210a and 210b serve as high electric transport layers, each having resistivity of about $10^{-6}$ to $10^{-2}$ $\Omega\cdot$cm, and the metal layer 215 provided at portions other than the bonding portion between the upper base 105a and the dielectric body 205 may be formed by thermally spraying a metal such as aluminium or the like and is reliably electrically connected to the conductive adhesive layers 210a and 210b.

In accordance with the third embodiment, a through channel is formed by providing the plate 500 in the upper base 105a and the dielectric body 205, the plate 500 being integrated with the ceramic tubes 500a. The plate 500 is formed in a pin frog shape where the ceramic tubes 500a are disposed on and integrated with a ceramic plate 500b as a unit.

The ceramic tubes 500a are inserted into through channels formed at the upper electrode main body and fixed thereto by the ceramic tube adhesive layers 310. The ceramic plate 500b is fixed to the plasma side surface of the upper electrode main body by the ceramic tube adhesive layers 310 as well.

On a bottom surface of the ceramic plate 500b, the consumable top plate 405 is covered by interposing the top plate adhesive layer 400. The consumable top plate 405 can be exchanged by using the detachable top plate adhesive layer 400.

In accordance with the present embodiment, the conductive adhesive layers 210a and 210b and the metal layer 215 are covered by the frog-shaped integrated plate 500 without being exposed to plasma generation space. Hence, in the present embodiment, when the consumable top plate 405 is exchanged, it is possible to prevent the metal from being peeled off from the metal layer 215 and causing contamination of the chamber due to repetitive adhesion and separation of the top plate adhesive layer 400.

Besides, similarly to the above-mentioned embodiments, since the upper base 105a and the dielectric body 205 are formed of the same material, the thermal expansion difference is not developed. This makes it possible to avoid problems such as occurrence of cracks and contamination of the chamber.

In accordance with the first to the third embodiment, it is possible to provide a plasma processing apparatus capable of stably controlling high frequency electric field strength.

While the invention has been shown and described with respect to the embodiments, it will be understood by those skilled in the art that various changes and modification may be made without departing from the scope of the invention as defined in the following claims.

For example, even though the metal layer 215 serving as a ground layer is electrically connected to the conductive adhesive layers 210a and 210b by covering the entire outer surfaces of the upper base 105a such that the conductive adhesive layers 210a and 210b have the ground potential in the above-described embodiments, the metal layer 215 may be partially provided on the outer surfaces of the upper base 105a. For example, the metal layer 215 may not be provided on the side surface of the upper base 105a as long as the conductive adhesive layers 210a and 210b are kept at the ground potential reliably. However, it is necessary to form the conductive adhesive layer 210b at the outer peripheral portion of the bottom surface of the upper base 105a.

Although the conductive adhesive layers 210a and 210b and the metal layer 215 have the ground potential in the aforementioned embodiments, the potential of the conductive adhesive layers 210a and 210b and the metal layer 215 is not limited thereto, and may be made to have a desired potential as long as the conductive adhesive layers 210a and 210b and the metal layer 215 have substantially the same potential. Accordingly, the high frequency power may be changed based on the position of the dielectric body 205.

Figure 9:
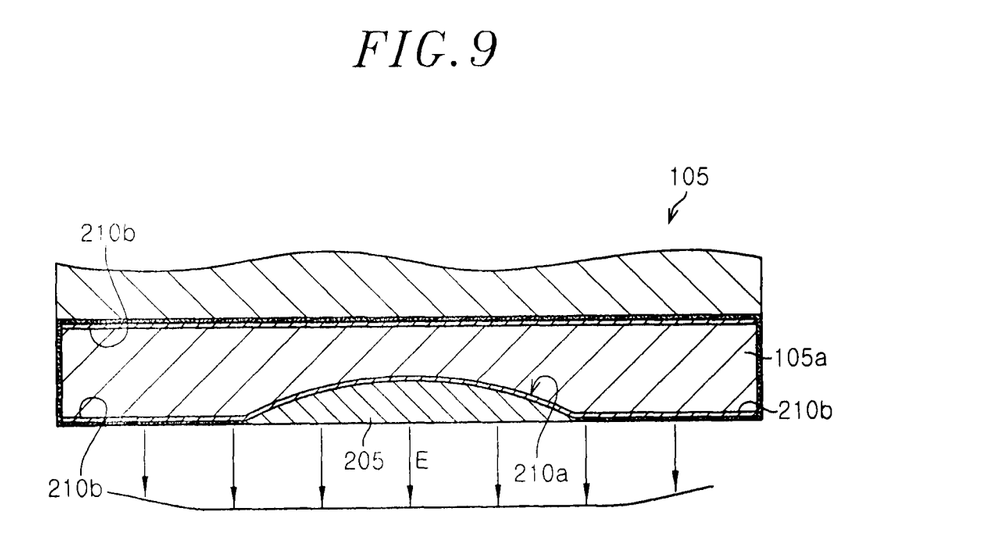
FIG. 9 is a cross sectional view of another example of the upper electrode.

In the above-described embodiments, the dielectric body has a tapered shape. However, a shape of the dielectric body of the present invention is not limited thereto, and may have another shape by which the uniformity of the plasma can be further improved. For example, as shown in FIG. 9, the dielectric body of the present invention may have a shape in which an ellipse is cut along a long axis direction, e.g., a shape where the tapered surface has a curvature, or a shape having a thickness that is gradually reduced from a central portion toward a peripheral portion.

Moreover, the dielectric body of the present invention may be disposed coaxially with the upper base 105a. Furthermore, the dielectric body of the present invention may be patterned and arranged at the portion where the plasma density is high.

The electrode of the preset invention is not necessarily applied to an upper electrode and may be applied to a lower electrode or both of the upper and the lower electrode. The plasma processing apparatus in accordance with the present invention may have a configuration in which the second electrode is disposed to face the first electrode in the processing chamber; a high frequency power is supplied to one of the first and the second electrode; and a target object is mounted on one of the first and the second electrode. At this time, the first electrode may be the upper electrode or the lower electrode. The second electrode serves as the lower electrode when the first electrode serves as the upper electrode, and vice versa.

The plasma processing apparatus of the present invention is not limited to a parallel plate processing apparatus. The plasma processing apparatus of the present invention may be an inductively coupled plasma processing apparatus, a microwave plasma processing apparatus or the like. The electrode of the present invention may be applied to another plasma processing apparatuses as well as a parallel plate plasma processing apparatus. Further, the plasma processing apparatus of the present invention is not limited to the etching apparatus and may be another apparatus using a plasma-process.

The target object may be a silicon wafer or a substrate. The present invention may be used for a Flat Panel Display (FPD).

What is claimed is:

1. A plasma processing apparatus comprising:
   a depressurizable processing chamber;
   an electrode provided in the processing chamber; and
   a high frequency power supply for supplying a high frequency power into the processing chamber to thereby generate a plasma,
   wherein the electrode includes;
      a base formed of a dielectric material;
      a dielectric body buried in the base and formed of the same dielectric material as the base; and
      a conductive adhesive layer provided in a bonding portion between the base and the dielectric body, the conductive adhesive layer bonding and fixing the base and the dielectric body together, and
   wherein the base includes a recess and the dielectric body is buried in the recess of the base.

2. The plasma processing apparatus of claim 1, wherein the conductive adhesive layer is controlled to have a preset electric potential and an electric field intensity of the high frequency power is changed depending on a position on the dielectric body.

3. The plasma processing apparatus of claim 2, wherein the conductive adhesive layer is controlled to have a ground potential.

4. The plasma processing apparatus of claim 1, wherein the conductive adhesive layer is controlled to have a ground potential.

5. The plasma processing apparatus of claim 4, wherein the recess has a tapered shape and is formed at a center of the base.

6. The plasma processing apparatus of claim 1, wherein the conductive adhesive layer has resistivity of about $10^{-6}$ to $10^{-2}$ $\Omega\cdot$cm.

7. The plasma processing apparatus of claim 1, wherein the base and the dielectric body are formed of one of alumina, silicon nitride, and aluminum nitride.

8. The plasma processing apparatus of claim 1, wherein the electrode further includes a metal layer provided to cover the base, the metal layer being electrically connected to the conductive adhesive layer and having substantially the same potential as the conductive adhesive layer.

9. The plasma processing apparatus of claim 8, wherein the electrode further includes one or more columnar conductive bodies provided to pass through the base, and the metal layer covers a top and a bottom surface of the base and is electrically connected to the columnar conductive bodies.

10. The plasma processing apparatus of claim 8, further comprising one or more clamps provided to fix the base to the processing chamber at an outer side surface of the base, wherein the metal layer covers a top and a bottom surface of the base and is electrically connected to the clamps.

11. The plasma processing apparatus of claim 1, wherein the dielectric body is patterned and provided at a position where a plasma density is high.

12. The plasma processing apparatus of claim 1, wherein the dielectric body is arranged coaxially with the base.

13. The plasma processing apparatus of claim 1, wherein the dielectric body has a thickness greater at a central portion than at a peripheral portion.

14. The plasma processing apparatus of claim 1, wherein the dielectric body has a tapered shape.

15. The plasma processing apparatus of claim 1, further comprising a facing electrode disposed to face the electrode in the processing chamber, wherein the high frequency power is applied to the electrode or the facing electrode, and a target object is mounted on the electrode or the facing electrode.

16. The plasma processing apparatus of claim 1, a plasma side surface of the electrode is covered by a consumable top plate, the consumable top plate being exchangeable.

17. The plasma processing apparatus of claim 1, wherein the electrode serves as an upper electrode and the upper electrode includes a plurality of gas inlet lines penetrating therethrough.

18. The plasma processing apparatus of claim 17, wherein the electrode further includes a gas diffusion portion diffusing a gas and communicating with the gas inlet lines, the gas diffusion portion being provided above the dielectric body in the base.

19. An electrode for use in a depressurizable processing chamber of a plasma processing apparatus configured to introduce a processing gas into the depressurizable processing chamber, generating a plasma by supplying a high frequency power to the processing chamber, and performing plasma processing on a target object, the electrode comprising:
   a base formed of a dielectric material;
   a dielectric body buried in the base and formed of the same material as the base; and
   a conductive adhesive layer provided between the base and the dielectric body to bond and fix therebetween,
   wherein the base includes a recess and the dielectric body is buried in the recess of the base.

20. The electrode of claim 19, further comprising a metal layer provided to cover the base, the metal layer being electrically connected to the conductive adhesive layer and having substantially the same potential as the conductive adhesive layer.

* * * * *